(12) United States Patent
Em

(10) Patent No.: US 9,607,713 B1
(45) Date of Patent: Mar. 28, 2017

(54) ELECTRONIC DEVICE AND METHOD FOR DRIVING THE SAME

(71) Applicant: SK hynix Inc., Gyeonggi-do (KR)

(72) Inventor: Ho-Seok Em, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/209,373

(22) Filed: Jul. 13, 2016

(30) Foreign Application Priority Data

Feb. 29, 2016 (KR) ........................ 10-2016-0024459

(51) Int. Cl.
| | |
|---|---|
| G11C 29/00 | (2006.01) |
| G11C 29/02 | (2006.01) |
| G11C 7/10 | (2006.01) |
| G11C 5/14 | (2006.01) |
| G06F 12/0806 | (2016.01) |

(52) U.S. Cl.
CPC .......... *G11C 29/02* (2013.01); *G06F 12/0806* (2013.01); *G11C 5/147* (2013.01); *G11C 7/1057* (2013.01); *G11C 7/1084* (2013.01); *G06F 2212/1024* (2013.01); *G06F 2212/281* (2013.01); *G06F 2212/608* (2013.01)

(58) Field of Classification Search
USPC ................................ 365/201, 189.09, 189.11
See application file for complete search history.

(56) References Cited

U.S. PATENT DOCUMENTS

| | | | |
|---|---|---|---|
| 7,698,077 B2 | 4/2010 | Brown et al. | |
| 7,773,440 B2 | 8/2010 | Kim et al. | |
| 2007/0234141 A1* | 10/2007 | Ausserlechner | G11C 29/12 714/718 |
| 2007/0258276 A1* | 11/2007 | Higashitani | G11C 16/0483 365/10 |

\* cited by examiner

*Primary Examiner* — Vu Le
(74) *Attorney, Agent, or Firm* — IP & T Group LLP

(57) ABSTRACT

An electronic device includes a semiconductor memory that includes: a first line; a second line intersecting the first line; a memory cell coupled at a cross point of the first line and the second line; and a test control circuit coupled between the first line and the second line and suitable for controlling parameters corresponding to operational characteristics of the memory cell and outputting a result information signal corresponding to the control result to a pad based on a clock signal and an initial value set signal.

20 Claims, 12 Drawing Sheets

ELECTRONIC DEVICE AND METHOD FOR DRIVING THE SAME

CROSS-REFERENCE TO RELATED APPLICATIONS

The present application claims priority of Korean Patent Application No. 10-2016-0024459, entitled "ELECTRONIC DEVICE AND METHOD FOR DRIVING THE SAME" and filed on Feb. 29, 2016, which is incorporated herein by reference in its entirety.

BACKGROUND

1. Field

This patent document relates to memory circuits or devices and their applications in electronic devices or system.

2. Description of the Related Art

Recently, as electronic appliances trend toward miniaturization, low power consumption, high performance, multi-functionality, and so on, semiconductor devices capable of storing information in various electronic appliances such as a computer, a portable communication device, and so on have been demanded in the art, and research has been conducted for the semiconductor devices. Such semiconductor devices include semiconductor devices which can store data using a characteristic that they are switched between different resistant states according to an applied voltage or current, for example, an RRAM (resistive random access memory), a PRAM (phase change random access memory), an FRAM (ferroelectric random access memory), an MRAM (magnetic random access memory), an E-fuse, etc.

SUMMARY

The disclosed technology in this patent document includes memory circuits or devices and their applications in electronic devices or systems and various implementations of an electronic device that may determine a threshold voltage of a memory cell, and a method for driving the electronic device.

In an implementation, an electronic device includes a semiconductor memory that includes: a first line; a second line intersecting the first line; a memory cell coupled at a cross point of the first line and the second line; and a test control circuit coupled between the first line and the second line and suitable for controlling parameters corresponding to operational characteristics of the memory cell and outputting a result information signal corresponding to the control result to a pad based on a clock signal and an initial value set signal.

Implementations of the above electronic device may include one or more the following.

The test control circuit may supply a ramp voltage to the first line based on a cell current flowing through the second line and output the result information signal corresponding to the cell current to the pad based on the clock signal and the initial value set signal. The test control circuit may include: a first control block suitable for generating the result information signal corresponding to the cell current and a count signal based on the clock signal and the initial value set signal; and a second control block suitable for generating the ramp voltage based on the count signal. The first control block may include: a sensing portion suitable for sensing the cell current; and a counting portion suitable for generating the count signal and the result information signal based on the clock signal, the initial value set signal and a sense signal outputted from the sensing portion, wherein the result information signal corresponds to a last count value of the count signal. The sensing portion may include: a current sinking unit suitable for sinking a reference current from the second line; and a sense signal generation unit suitable for generating the sense signal based on a voltage level of the second line wherein the voltage level of the second line is defined based on the cell current and the reference current. The second control block may include: a decoding portion suitable for generating a decoding signal based on the count signal; and a ramp voltage generation portion suitable for generating the ramp voltage based on the decoding signal.

The electronic device may further include a microprocessor which includes: a control unit suitable for receiving a signal including a command from an outside of the microprocessor, and performs extracting, decoding of the command, or controlling input or output of a signal of the microprocessor; an operation unit suitable for performing an operation based on a result that the control unit decodes the command; and a memory unit suitable for storing data for performing the operation, data corresponding to a result of performing the operation, or an address of data for which the operation is performed, wherein the semiconductor memory is part of the memory unit in the microprocessor.

The electronic device may further include a processor which includes: a core unit suitable for performing, based on a command inputted from an outside of the processor, an operation corresponding to the command, by using data; a cache memory unit suitable for storing data for performing the operation, data corresponding to a result of performing the operation, or an address of data for which the operation is performed; and a bus interface connected between the core unit and the cache memory unit, and suitable for transmitting data between the core unit and the cache memory unit, wherein the semiconductor memory that is part of the cache memory unit in the processor.

The electronic device may further include a processing system which includes: a processor suitable for decoding a command received by the processor and controlling an operation for information based on a result of decoding the command; an auxiliary memory device suitable for storing a program for decoding the command and the information; a main memory device suitable for calling and storing the program and the information from the auxiliary memory device such that the processor can perform the operation using the program and the information when executing the program; and an interface device suitable for performing communication between at least one of the processor, the auxiliary memory device and the main memory device and the outside, wherein the semiconductor memory is part of the auxiliary memory device or the main memory device in the processing system.

The electronic device may further include a data storage system which includes: a storage device suitable for storing data and conserving stored data regardless of power supply; a controller suitable for controlling input and output of data to and from the storage device according to a command inputted from an outside; a temporary storage device suitable for temporarily storing data exchanged between the storage device and the outside; and an interface suitable for performing communication between at least one of the storage device, the controller and the temporary storage device and the outside, wherein the semiconductor memory is part of the storage device or the temporary storage device in the data storage system.

The electronic device may further include a memory system which includes: a memory suitable for storing data and conserving stored data regardless of power supply; a memory controller suitable for controlling input and output of data to and from the memory according to a command inputted from an outside; a buffer memory suitable for buffering data exchanged between the memory and the outside; and an interface suitable for performing communication between at least one of the memory, the memory controller and the buffer memory and the outside, wherein the semiconductor memory is part of the memory or the buffer memory in the memory system.

In another implementation, an electronic device includes a semiconductor memory that includes: a first line; a second line intersecting the first line; a memory cell coupled at a cross point of the first line and the second line; and a test control circuit suitable for supplying first and second ramp voltages to the first and second lines based on a cell current flowing through the second line and outputting a result information signal corresponding to the cell current to a pad based on a clock signal and an operation control signal.

Implementations of the above electronic device may include one or more the following.

The test control circuit may include: a first control block suitable for generating the result information signal corresponding to a voltage level of the second line and a ramp enable signal based on the clock signal and the operation control signal; and a second control block suitable for generating the first and second ramp voltages based on the ramp enable signal. The first control block may include: a sensing portion suitable for sensing the cell current; a counting portion suitable for generating a count signal based on a count enable signal and a count clock signal; and a control logic portion suitable for generating the count enable signal, the count clock signal, the ramp enable signal and the ramp enable signal based on the sense signal, the count signal, the clock signal and the operation control signal, wherein the result information signal corresponds to a last count value of the count signal. The sensing portion may include: a current sinking unit suitable for sinking a reference current from the second line; and a sense signal generation unit suitable for generating the sense signal based on the voltage level of the second line wherein the voltage level of the second line is defined based on the cell current and the reference current. The second control block may include: a first ramp voltage generation portion suitable for generating the first ramp voltage that ramps from a reference voltage to a high voltage based on the ramp enable signal; and a second ramp voltage generation portion suitable for generating the second ramp voltage that ramps from the reference voltage to a low voltage based on the ramp enable signal. The first ramp voltage generation portion may include: a voltage charging unit suitable for precharging a first node with the reference voltage based on an inversion signal of the ramp enable signal and sourcing a first current to the first node based on the ramp enable signal; and a first ramp voltage output unit suitable for outputting a voltage loaded on the first node as the first ramp voltage. The second ramp voltage generation portion may include: a voltage discharging unit suitable for precharging a second node with the reference voltage based on the inversion signal and sinking a second current from the second node based on the ramp enable signal; and a second ramp voltage output unit suitable for outputting a voltage loaded on the second node as the second ramp voltage.

In another implementation, a method for driving an electronic device including a semiconductor memory includes: gradually increasing a voltage difference between both sides of memory cell including a variable resistance element and a selection element; and determining a threshold voltage of the memory cell based on a voltage level of one side of the memory cell.

Implementations of the above method may include one or more of the following.

The gradual increasing of the voltage difference may include supplying a ramp voltage to the other side of the memory cell while one side of the memory cell is fixed at a low voltage, or supplying a first ramp voltage that ramps from a reference voltage to a high voltage to one side of the memory cell and supplying a second ramp voltage that ramps from the reference voltage to a low voltage to the other side of the memory cell.

DETAILED DESCRIPTION

Figure 1:
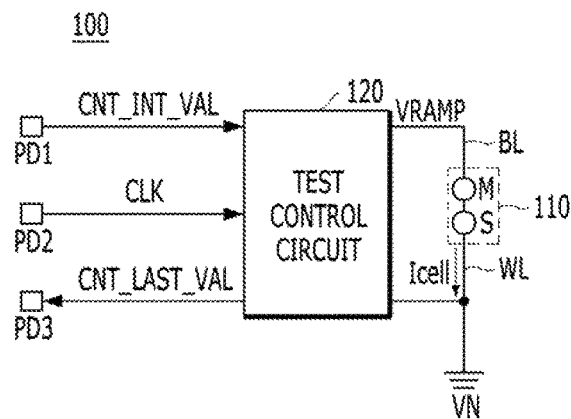
FIG. 1 is a block diagram illustrating a memory device in accordance with an implementation of the present disclosure.

Various examples and implementations of the disclosed technology are described below in detail with reference to the accompanying drawings. The drawings may not be necessarily to scale and in some instances, proportions of at least some of structures in the drawings may have been exaggerated in order to clearly illustrate certain features of the described examples or implementations. In presenting a specific example in a drawing or description having two or more layers in a multi-layer structure, the relative positioning relationship of such layers or the sequence of arranging the layers as shown reflects a particular implementation for the described or illustrated example and a different relative positioning relationship or sequence of arranging the layers may be possible. In addition, a described or illustrated example of a multi-layer structure may not reflect all layers present in that particular multi-layer structure (e.g., one or more additional layers may be present between two illustrated layers). As a specific example, when a first layer in a described or illustrated multi-layer structure is referred to as being "on" or "over" a second layer or "on" or "over" a substrate, the first layer may be directly formed on the second layer or the substrate but may also represent a structure where one or more other intermediate layers may exist between the first layer and the second layer or the substrate.

A semiconductor memory device in accordance with implementations of the disclosed technology may include a variable resistance element that exhibits a variable resistance characteristic that allows for representing different digital bits or states by different resistance values of the variable resistance element. In implementations, such a variable resistance element may include a single layer or a multi layer that exhibits the variable resistance characteristic and includes a material used in a RRAM, PRAM, STTRAM, MRAM or FRAM (e.g., a ferromagnetic material), a ferroelectric material, a phase change material such as a chalcogenide material, a metal oxide such as a perovskite material, and/or a transition metal oxide.

The variable resistance element may include a metal oxide, e.g., a transition metal oxide such as a nickel (Ni) oxide, a titanium oxide (TiO), a hafnium oxide (HfO), a zirconium oxide (ZrO), a tungsten oxide (WO) or a cobalt oxide (CoO), and/or a perovskite material such as a strontium titanium oxide (STO:SrTiO) and/or a praseodymium calcium manganese oxide (PCMO:PrCaMnO).

Moreover, the variable resistance element may include a phase change material. The phase change material may include a chalcogenide material such as germanium-antimony-tellurium (GST:GeSbTe). The variable resistance element switches between different resistance states by changing a crystal state or an amorphous state using a heat.

The variable resistance element may include two magnetic layers and a tunnel barrier layer interposed between the two magnetic layers. The magnetic layer may include nickel-ferrum-cobalt (NiFeCo) or Cobalt-ferrum (CoFe), etc. The tunnel barrier layer may include aluminum oxide $Al_2O_3$. The variable resistance element may switch between two different resistance states according to a magnetization direction of the magnetic layer. For example, the variable resistance element may be in a low resistance state when a magnetization direction of two magnetic layers is parallel, and be in a high resistance state when a magnetization direction of two magnetic layers is anti-parallel.

FIG. 1 is a block diagram illustrating a memory device 100 in accordance with an implementation of the present disclosure.

Referring to FIG. 1, the memory device 100 may include a memory cell 110 and a test control circuit 120.

The memory cell 110 may be coupled between a bit line BL and a word line WL. The memory cell 110 may include a variable resistance element M and a selection element S that are connected in series between the bit line BL and the word line WL. For example, the variable resistance element M may include a phase change material. In this case, the variable resistance element M may have a low resistance state which is a crystalline state or a high resistance state which is an amorphous state. The selection element S may include a diode or Ovonic Threshold Switch (OTS) element. In this case, it may be determined whether or not the selection element S is switched based on a voltage difference between both sides of the memory cell 110, i.e., a voltage difference between the bit line BL and the word line WL.

Although a single memory cell is illustrated in FIG. 1, the present embodiment is not limited to this, and a memory cell array including a plurality of memory cells may be employed. The memory cell array may, for example, have a cross point array structure, wherein a plurality of memory cells are arranged at cross points between a plurality of bit lines and a plurality of word lines.

The test control circuit 120 may be coupled between the bit line BL and the word line WL. The test control circuit 120 may control parameters corresponding to operational characteristics of the memory cell 110 and generate a result information signal CNT_LAST_VAL corresponding to the control result, based on a clock signal CLK and an initial value set signal CNT_INT_VAL. For example, the test control circuit 120 may supply a ramp voltage VRAMP to the bit line BL based on a cell current Icell flowing through the word line WL and generate the result information signal CNT_LAST_VAL corresponding to the cell current Icell, based on the clock signal CLK and the initial value set signal CNT_INT_VAL. In this case, the word line WL may be fixed at a low voltage VN. For example, the low voltage VN may include a negative voltage having a voltage level lower than a ground voltage VSS.

The cell current Icell may include a current flowing through the bit line BL, the memory cell 110 and the word line WL. The initial value set signal CNT_INT_VAL may be inputted to the test control circuit 120 through a first pad PD1, and the clock signal CLK may be inputted to the test control circuit 120 through a second pad PD2. The result information signal CNT_LAST_VAL may be outputted from the test control circuit 120 to a third pad PD3.

Figure 2:
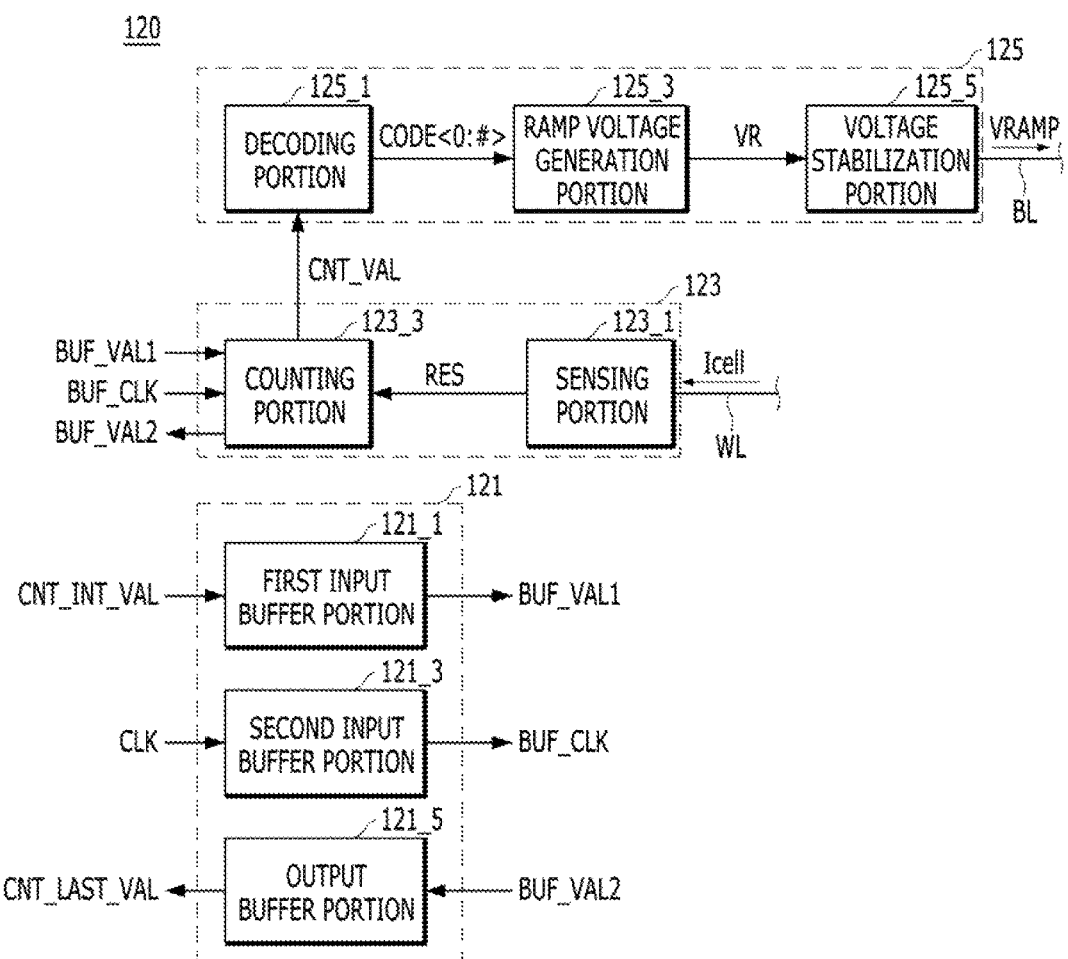
FIG. 2 is a block diagram illustrating a test control circuit shown in FIG. 1.

FIG. 2 is a block diagram illustrating the test control circuit 120 shown in FIG. 1.

Referring to FIG. 2, the test control circuit 120 may include a buffer block 121, a first control block 123, and a second control block 125.

The buffer block 121 may generate a buffered initial value set signal BUF_VAL1, a buffered clock signal BUF_CLK, and the result information signal CNT_LAST_VAL corresponding to the initial value set signal CNT_INT_VAL, the clock signal CLK, and a to-be-buffered result information signal BUF_VAL2, respectively.

For example, the buffer block 121 may include first and second input buffer portions 121_1 and 121_3 and an output buffer portion 121_5. The first input buffer portion 121_1 may buffer the initial value set signal CNT_INT_VAL to generate the buffered initial value set signal BUF_VAL1. The second input buffer portion 121_3 may buffer the clock signal CLK to generate the buffered clock signal BUF_CLK. The output buffer portion 121_5 may buffer the to-be-buffered result information signal BUF_VAL2 to generate the result information signal CNT_LAST_VAL.

The first control block 123 may generate the result information signal CNT_LAST_VAL and a count signal CNT_VAL corresponding to the cell current Icell based on the clock signal CLK and the initial value set signal CNT_INT_VAL.

For example, the first control block 123 may include a sensing portion 123_1 and a counting portion 123_3. The sensing portion 123_1 may sense the cell current Icell flowing through the word line WL to generate a sense signal RES corresponding to the sense result. For example, the sensing portion 123_1 may compare the cell current Icell with a reference current Iref to generate the sense signal RES corresponding to the comparison result. The sensing portion 123_1 is described in detail below (refer to FIG. 3). The counting portion 123_3 may generate the count signal CNT_VAL that is sequentially counted from a predetermined initial count value and may generate the to-be-buffered result information signal BUF_VAL2 corresponding to a last count value of the count signal CNT_VAL, based on the buffered clock signal BUF_CLK, the buffered initial value set signal BUF_VAL1 and the sense signal RES.

The second control block 125 may generate the ramp voltage VRAMP based on the count signal CNT_VAL.

For example, the second control block 125 may include a decoding portion 125_1, a ramp voltage generation portion 125_3, and a voltage stabilization portion 125_5. The decoding portion 125_1 may generate decoding signals CODE<0:#> that are sequentially varied based on the count signal CNT_VAL. The ramp voltage generation portion 125_3 may generate a ramp voltage VR whose voltage level gradually increases, based on the decoding signals CODE<0:#>. The voltage stabilization portion 125_5 may generate the ramp voltage VRAMP whose voltage level is stabilized, based on the ramp voltage VR. For example, the voltage stabilization portion 125_5 may include a voltage regulator. The voltage stabilization portion 125_5 may be optional. When the voltage stabilization portion 125_5 is not employed, the ramp voltage VR outputted from the ramp voltage generation portion 125_3 may be outputted to the bit line BL.

Figure 3:
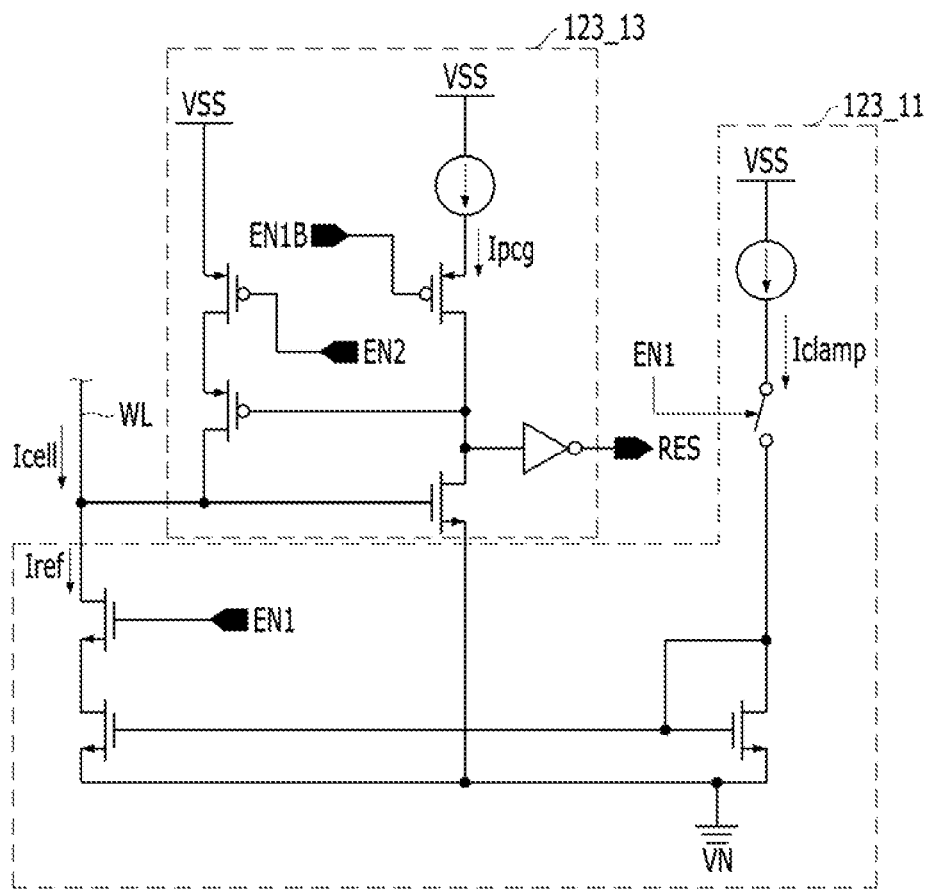
FIG. 3 is a circuit diagram illustrating a sensing portion shown in FIG. 2.

FIG. 3 is a circuit diagram illustrating the sensing portion 123_1 shown in FIG. 2.

Referring to FIG. 3, the sensing portion 123_1 may include a current sinking unit 123_11 and a sense signal generation unit 123_13.

The current sinking unit 123_11 may sink the reference current Iref corresponding to a set current Iclamp from the word line WL based on a first enable signal EN1. For example, the current sinking unit 123_11 may mirror the set current Iclamp to generate the reference current Iref. The reference current Iref may be set smaller than the cell current Icell flowing through the memory cell 110 after the selection element S is switched.

The sense signal generation unit 123_13 may generate the sense signal RES corresponding to a voltage level of the word line WL based on a first inversion enable signal EN1B, which is an inversion signal of the first enable signal EN1, and a second enable signal EN2. The voltage level of the word line WL may be defined based on the cell current Icell and the reference current Iref. For example, when the reference current Iref is greater than the cell current Icell, the voltage level of the word line WL corresponds to the low voltage VN. In this case, the sense signal generation unit 123_13 may generate the sense signal RES having a logic low level corresponding to a precharge current Ipcg. When the cell current Icell is greater than the reference current Iref, the voltage level of the word line WL corresponds to the ramp voltage VRAMP (See FIG. 2). In this case, the sense signal generation unit 123_13 may generate the sense signal RES having a logic high level regardless of the precharge current Ipcg.

The sense signal generation unit 123_13 may drive the word line WL with the ground voltage VSS based on the second enable signal EN2. This may prevent an overcurrent from flowing through the memory cell 110 by reducing the voltage levels of both sides of the memory cell 110 when the overcurrent flows through the memory cell 110.

Figure 4:
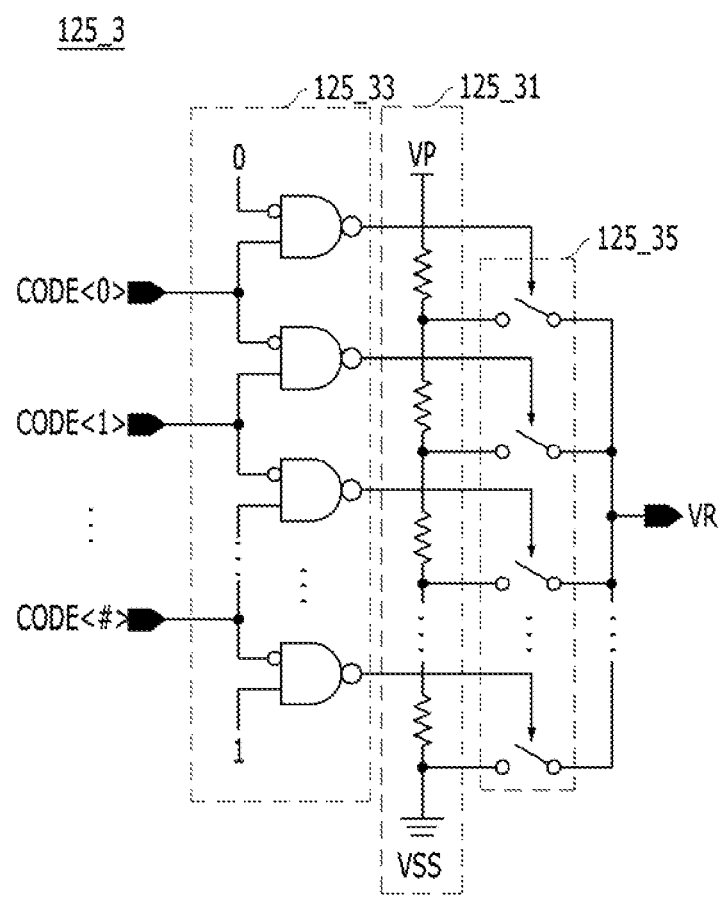
FIG. 4 is a circuit diagram illustrating a ramp voltage generation portion shown in FIG. 2.

FIG. 4 is a circuit diagram illustrating the ramp voltage generation portion 125_3 shown in FIG. 2.

Referring to FIG. 4, the ramp voltage generation portion 125_3 may include a voltage division unit 236_31, a switching control unit 125_33, and a switching unit 125_35.

The voltage division unit 236_31 may generate a plurality of division voltages that are divided at a predetermined division ratio in a ramping range of the ramp voltage VR.

The switching control unit 125_33 may generate a plurality of switching signals based on the decoding signals CODE<0:#>.

The switching unit 125_35 may output the division voltages as the ramp voltage VR in order of lower voltage level based on the switching signals.

Hereinafter, an operation of the memory device 100 having the aforementioned structure is described with reference to FIG. 5.

Figure 5:
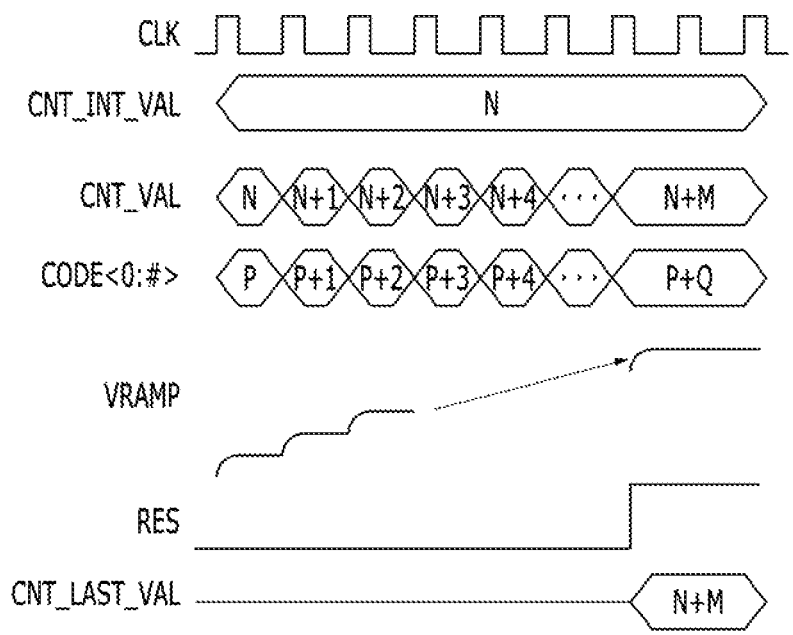
FIG. 5 is a timing diagram for describing an operation of the memory device shown in FIG. 1.

FIG. 5 is a timing diagram for describing the operation of the memory device 100 shown in FIG. 1.

Referring to FIG. 5, the test control circuit 120 may determine a threshold voltage of the memory cell 110 by gradually increasing a voltage difference between both sides of the memory cell 110. For example, while the word line WL is fixed at the low voltage VN, the test control circuit 120 may supply to the bit line BL the ramp voltage VRAMP whose voltage level gradually increases, and the test control circuit 120 may determine the threshold voltage of the memory cell 110 based on the cell current Icell flowing through the bit line BL, the memory cell 110 and the word line WL. The threshold voltage may be an operation voltage for turning on the selection element S included in the memory cell 110 and may correspond to the voltage difference between both sides of the memory cell 110.

The operation of the test control circuit 120 is described in detail below.

The first input buffer portion 121_1 may buffer the initial value set signal CNT_INT_VAL to generate the buffered initial value set signal BUF_VAL1. The second input buffer portion 121_3 may buffer the clock signal CLK to generate the buffered clock signal BUF_CLK.

The sensing portion 123_1 may continuously sense the cell current Icell flowing through the word line WL to generate the sense signal RES corresponding to the sense result. For example, the sensing portion 123_1 may compare the cell current Icell with the reference current Iref to generate the sense signal RES having a logic low level when the reference current is larger than the cell current Icell and generate the sense signal RES having a logic high level when the cell current Icell is larger than the reference current Iref.

The counting portion 123_3 may generate the count signal CNT_VAL that is sequentially counted from an initial count value N corresponding to the initial value set signal CNT_INT_VAL based on the buffered initial value set signal BUF_VAL1, the buffered clock signal BUF_CLK and the sense signal RES.

The decoding portion 125_1 may generate the decoding signals CODE<0:#> that are sequentially varied based on the count signal CNT_VAL.

The ramp voltage generation portion 125_3 may generate the ramp voltage VR whose voltage level gradually increases, based on the decoding signals CODE<0:#>.

The voltage stabilization portion 125_5 may generate the ramp voltage VRAMP whose voltage level is stabilized, based on the ramp voltage VR.

Subsequently, when the voltage difference between both sides of the memory cell 110 reaches the threshold voltage, the sensing portion 123_1 may generate the sense signal RES having the logic high level. For example, the selection element S included in the memory cell 110 may be turned on based on the voltage difference corresponding to the threshold voltage. Thus, the cell current Icell flowing through the bit line BL, the memory cell 110 and the word line WL may increase. The sensing portion 123_1 may generate the sense signal RES having the logic high level since the cell current Icell is larger than the reference current Iref as a result of comparing the cell current Icell with the reference current Iref.

The counting portion 123_3 may detect a count value N+M counted until now as a last count value N+M based on the sense signal RES of the logic high level and may generate the to-be-buffered result information signal BUF_VAL2 corresponding to the last count value N+M.

The output buffer portion 121_5 may buffer the to-be-buffered result information signal BUF_VAL2 to generate the result information signal CNT_LAST_VAL.

The foregoing operation may be performed on the variable resistance element M of a low resistance state and the variable resistance element M of a high resistance state. Therefore, the threshold voltage corresponding to the low resistance state (hereinafter, referred to as a "first threshold voltage") and the threshold voltage corresponding to the high resistance state (hereinafter, referred to as a "second threshold voltage") may be determined. In actuality, since the foregoing operation is performed on a plurality of memory cells, a distribution of a plurality of first threshold voltages and second threshold voltages corresponding to the memory cells may be determined. This may be used as an important factor when an optimum read condition, e.g., a read voltage, is set.

Figure 6:
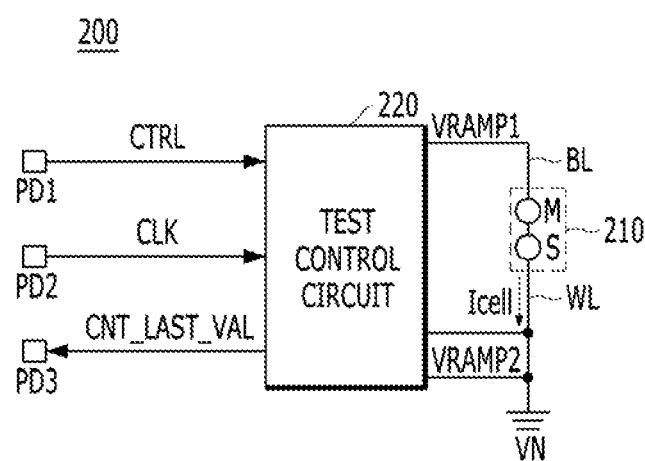
FIG. 6 is a block diagram illustrating a memory device in accordance with another implementation of the present disclosure.

FIG. 6 is a block diagram illustrating a memory device 200 in accordance with another implementation of the present disclosure.

Referring to FIG. 6, the memory device 200 may include a memory cell 210 and a test control circuit 220.

Since the memory cell 210 has the same structure as the memory cell 110 shown in FIG. 1, a detailed description thereof is omitted herein.

The test control circuit 220 may be coupled between a bit line BL and a word line WL. The test control circuit 220 may control parameters corresponding to operational characteristics of the memory cell 210 and generate a result information signal CNT_LAST_VAL corresponding to the control result, based on a clock signal CLK and an operation control signal CTRL. For example, the test control circuit 220 may supply first and second ramp voltages VRAMP1 and VRAMP2 to the bit line BL and the word line WL and generate the result information signal CNT_LAST_VAL corresponding to a cell current Icell flowing through the word line WL, based on the clock signal CLK and the operation control signal CTRL.

The cell current Icell may include a current flowing through the bit line BL, the memory cell 210 and the word line WL. The operation control signal CTRL may be inputted to the test control circuit 220 through a first pad PD1, and the clock signal CLK may be inputted to the test control circuit 220 through a second pad PD2. The result information signal CNT_LAST_VAL may be outputted from the test control circuit 220 to a third pad PD3.

Figure 7:
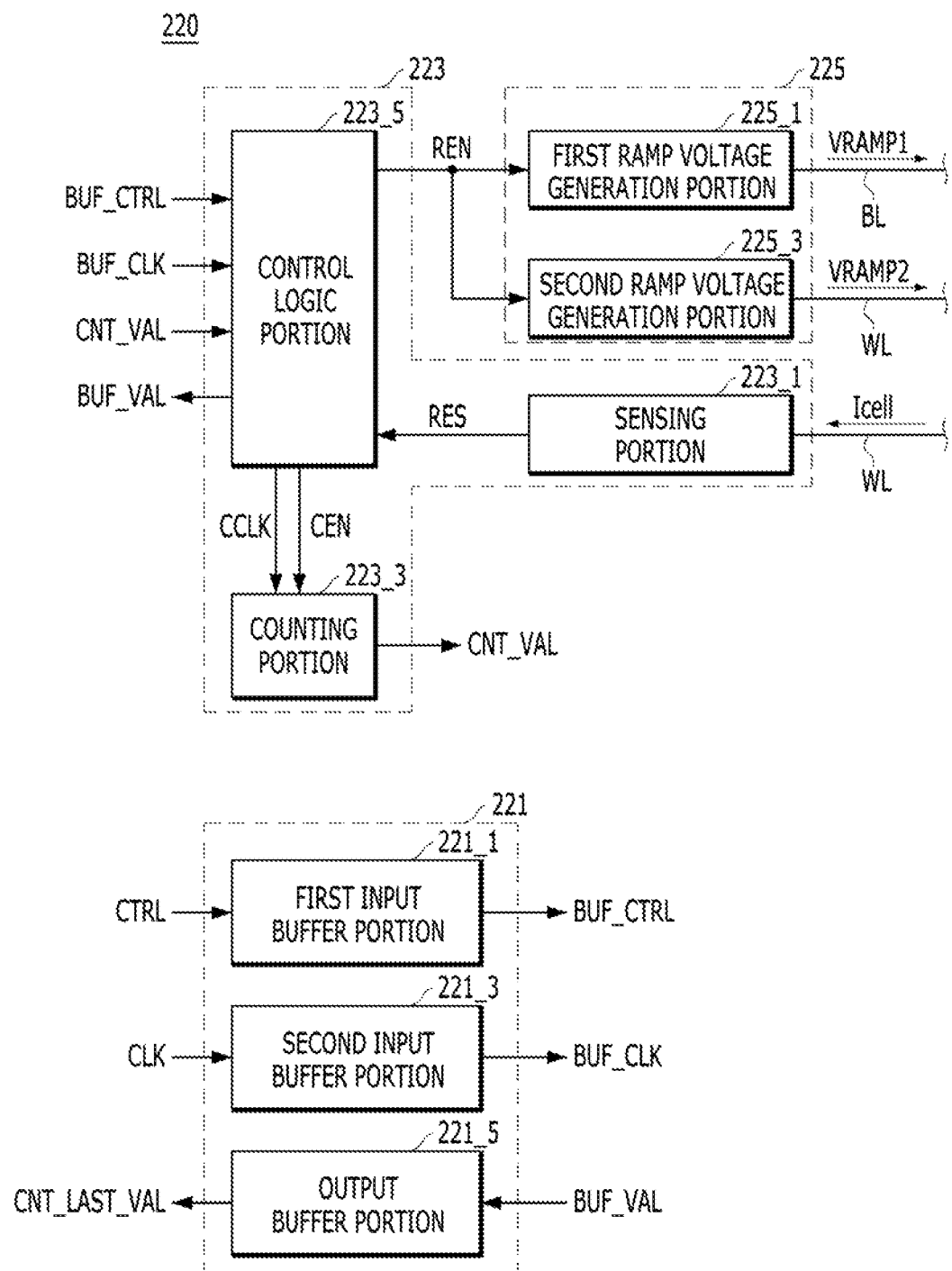
FIG. 7 is a block diagram illustrating a test control circuit shown in FIG. 6.

FIG. 7 is a block diagram illustrating the test control circuit 220 shown in FIG. 6.

Referring to FIG. 7, the test control circuit 220 may include a buffer block 221, a first control block 223, and a second control block 225.

The buffer block 221 may generate a buffered operation control signal BUF_CTRL, a buffered clock signal BUF_CLK, and the result information signal CNT_LAST_VAL corresponding to the operation control signal CTRL, the clock signal CLK, and a to-be-buffered result information signal BUF_VAL, respectively.

For example, the buffer block 221 may include first and second input buffer portions 221_1 and 221_3 and an output buffer portion 221_5. The first input buffer portion 221_1 may buffer the operation control signal CTRL to generate the buffered operation control signal BUF_CTRL. The second input buffer portion 221_3 may buffer the clock signal CLK to generate the buffered clock signal BUF_CLK. The output buffer portion 221_5 may buffer the to-be-buffered result information signal BUF_VAL to generate the result information signal CNT_LAST_VAL.

The first control block 223 may generate the to-be-buffered result information signal BUF_VAL and a ramp enable signal REN corresponding to the cell current Icell based on the buffered clock signal BUF_CLK and the buffered operation control signal BUF_CTRL.

For example, the first control block 223 may include a sensing portion 223_1, a counting portion 223_3, and a control logic portion 223_5. The sensing portion 223_1 may sense the cell current Icell flowing through the word line WL to generate a sense signal RES corresponding to the sense result. The sensing portion 223_1 may have the same structure as the sensing portion 123_1 shown in FIG. 2. The counting portion 223_3 may generate a count signal CNT_VAL based on a count clock signal CCLK and a count enable signal CEN. The control logic portion 223_5 may generate the count enable signal CEN, the count clock signal CCLK, the to-be-buffered result information signal BUF_VAL, and the ramp enable signal REN, based on the buffered operation control signal BUF_CTRL, the buffered operation control signal BUF_CTRL, the sense signal RES and the count signal CNT_VAL. The to-be-buffered result information signal BUF_VAL may correspond to a last count value of the count signal CNT_VAL.

The second control block 225 may generate the first and second ramp voltages VRAMP1 and VRAMP2 based on the ramp enable signal REN.

For example, the second control block 225 may include a first ramp voltage generation portion 225_1 and a second ramp voltage generation portion 225_3. The first ramp voltage generation portion 225_1 may generate the first ramp voltage VRAMP1 that ramps from a reference voltage VSTB to a high voltage VP based on the ramp enable signal REN (see FIG. 9). The second ramp voltage generation portion 225_3 may generate the second ramp voltage VRAMP2 that ramps from the reference voltage VSTB to a low voltage VN based on the ramp enable signal REN (see FIG. 10).

Figure 8:
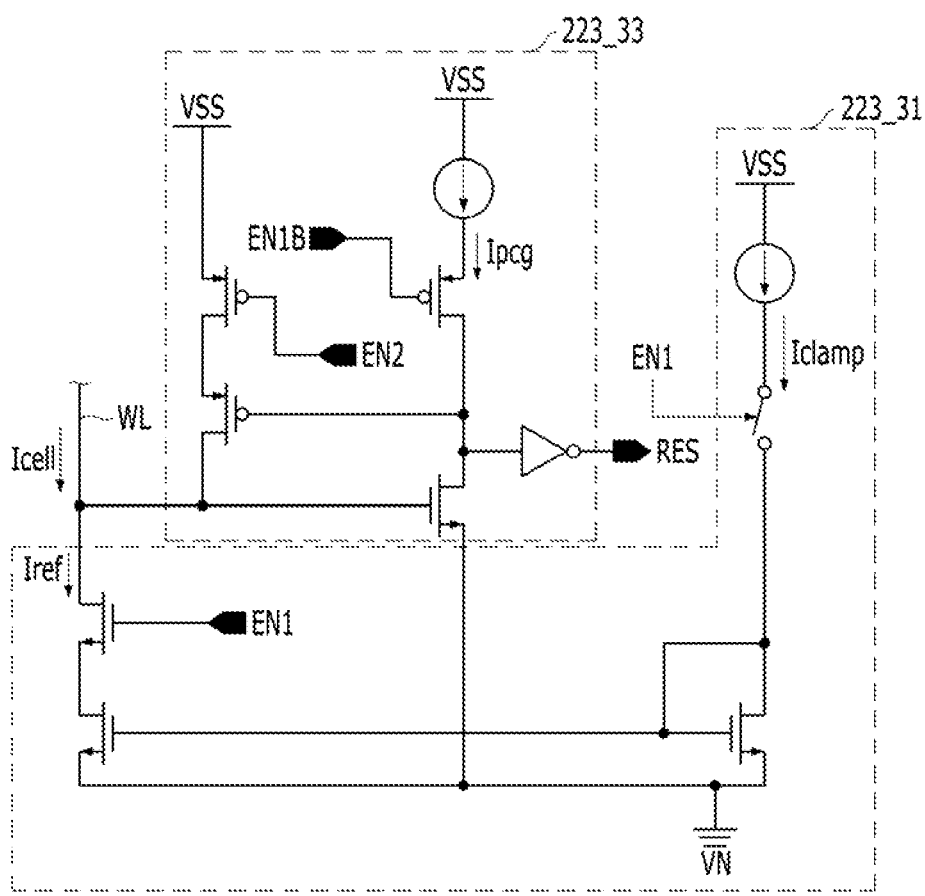
FIG. 8 is a circuit diagram illustrating a sensing portion shown in FIG. 6.

FIG. 8 is a circuit diagram illustrating the sensing portion 223-1 shown in FIG. 6. Since the sensing portion 223-1 shown in FIG. 8 has the same structure as the sensing portion 123-1 shown in FIG. 3, a detailed description on the sensing portion 223-1 is omitted herein (refer to FIG. 3).

Figure 9:
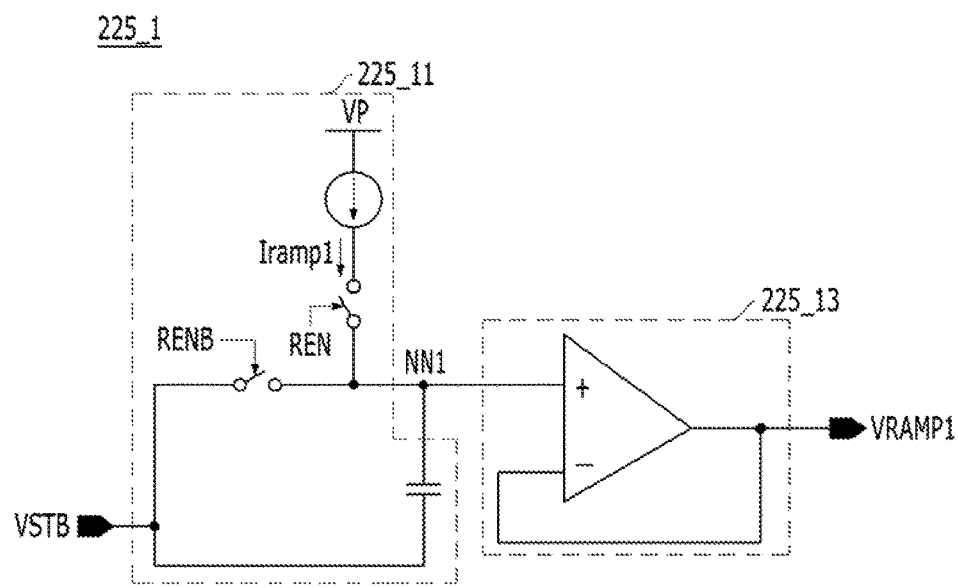
FIG. 9 is a circuit diagram illustrating a first ramp voltage generation portion shown in FIG. 6.

FIG. 9 is a circuit diagram illustrating the first ramp voltage generation portion 225_1 shown in FIG. 6.

Referring to FIG. 9, the first ramp voltage generation portion 225_1 may include a voltage charging unit 225_11 and a first ramp voltage output unit 225_13.

The voltage charging unit 225_11 may precharge a first node with the reference voltage VSTB based on an inversion signal RENB of the ramp enable signal REN. In addition, the voltage charging unit 225_11 may increase a voltage level of the first node NN1 from a reference voltage VSTB level to a high voltage VP level by sourcing a first current Iramp1 corresponding to the first ramp voltage VRAMP1 to the first node NN1 based on the ramp enable signal REN. For example, the voltage charging unit 225_11 may include a first precharging switch element, a first capacitive element, a charging switch element, and a first current source. The first precharging switch element may be coupled between a reference voltage VSTB terminal and the first node NN1 and may be open or short based on the inversion signal RENB of the ramp enable signal REN. The first capacitive element may be coupled in parallel with the first precharging switch element between the reference voltage VSTB terminal and the first node NN1. The charging switch element may be coupled between the first current source and the first node NN1 and may be open or short based on the ramp enable signal REN. The first current source may be coupled between a high voltage VP terminal and the charging switch element and may generate the first current Iramp1.

The first ramp voltage output unit 225_13 may output a voltage loaded on the first node NN1 as the first ramp voltage VRAMP1. For example, the first ramp voltage output unit 225_13 may include a voltage follower.

Figure 10:
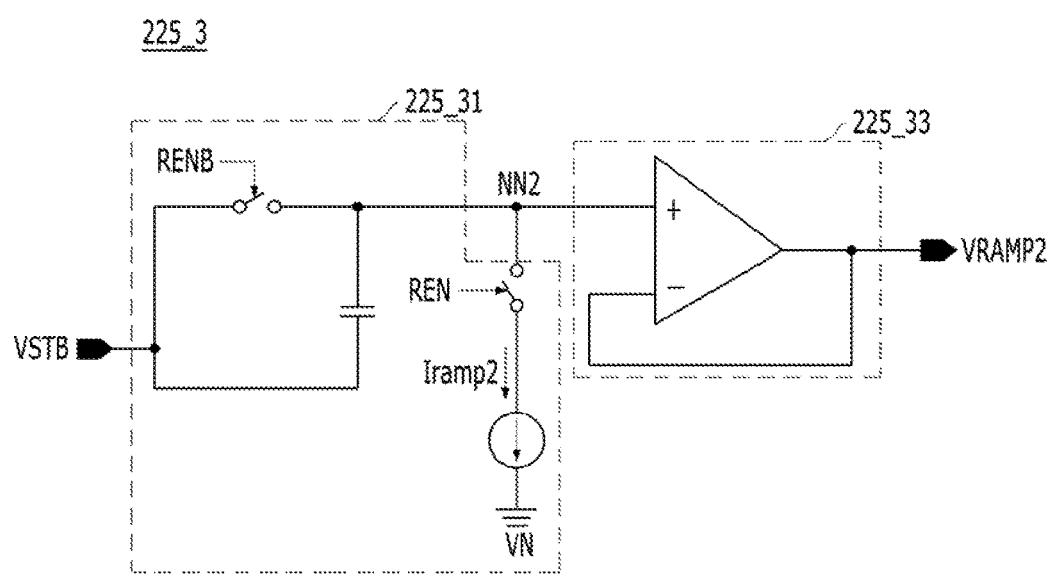
FIG. 10 is a circuit diagram illustrating a second ramp voltage generation portion shown in FIG. 6.

FIG. 10 is a circuit diagram illustrating the second ramp voltage generation portion 225_3 shown in FIG. 6.

Referring to FIG. 10, the second ramp voltage generation portion 225_3 may include a voltage discharging unit 225_31 and a second ramp voltage output unit 225_33.

The voltage discharging unit 225_31 may decrease a voltage level of a second node NN2 from the reference voltage VSTB level to a low voltage VN level by precharging the second node NN2 with the reference voltage VSTRB based on the inversion signal RENB and sinking a second current Iramp2 from the second node NN2 based on the ramp enable signal REN. For example, the voltage discharging unit 225_31 may include a second precharging switch element, a second capacitive element, a discharging switch element, and a second current source. The second precharging switch element may be coupled between the reference voltage VSTB terminal and the second node NN2 and may be open or short based on the inversion signal RENB. The second capacitive element may be coupled in parallel with the second precharging switch element between the reference voltage VSTB terminal and the second node NN2. The discharging switch element may be coupled between the second current source and the second node NN2 and may be open or short based on the ramp enable signal REN. The second current source may be coupled between a low voltage VN terminal and the discharging switch element and may generate the second current Iramp2.

The second ramp voltage output unit 225_33 may output a voltage loaded on the second node NN2 as the second ramp voltage VRAMP2. For example, the second ramp voltage output unit 225_33 may include a voltage follower.

Hereinafter, an operation of the memory device 200 having the aforementioned structure is described with reference to FIG. 11.

Figure 11:
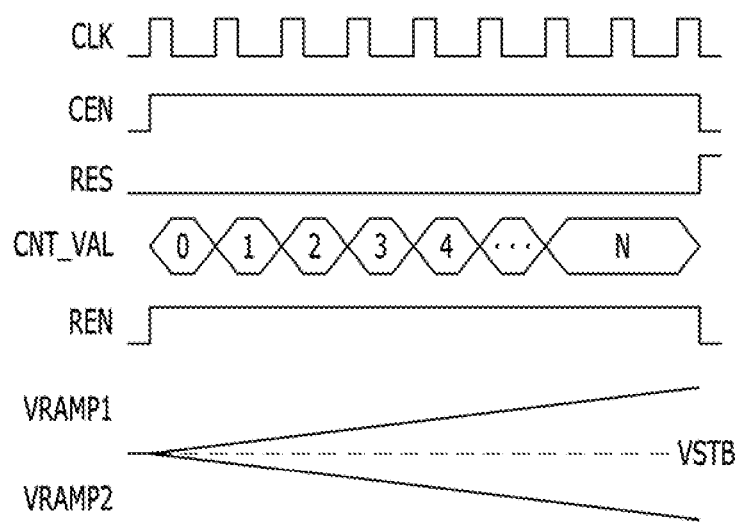
FIG. 11 is a timing diagram for describing an operation of the memory device shown in FIG. 6.

FIG. 11 is a timing diagram for describing the operation of the memory device 200 shown in FIG. 6.

Referring to FIG. 11, the test control circuit 220 may determine a threshold voltage of the memory cell 210 by gradually increasing a voltage difference between both sides of the memory cell 210. For example, the test control circuit 220 may supply to the bit line BL the first ramp voltage VRAMP1 that ramps from the reference voltage VSTB level to the high voltage VP level and supply to the word line WL the second ramp voltage VRAMP2 that ramps from the reference voltage VSTB level to the low voltage VN level. In addition, the test control circuit 220 may determine the threshold voltage of the memory cell 210 based on the cell current Icell flowing through the bit line BL, the memory cell 210 and the word line WL. The threshold voltage may be a voltage for turning on the selection element S included in the memory cell 210 and may correspond to the voltage difference between both sides of the memory cell 210.

The operation of the test control circuit 220 is described in detail below.

The first input buffer portion 221_1 may buffer the operation control signal CTRL to generate the buffered operation control signal BUF_CTRL. The second input buffer portion 221_3 may buffer the clock signal CLK to generate the buffered clock signal BUF_CLK.

The sensing portion 223_1 may continuously sense the cell current Icell flowing through the word line WL to generate the sense signal RES corresponding to the sense result. For example, the sensing portion 223_1 may compare the cell current Icell with the reference current Iref to generate the sense signal RES having a logic low level when the reference current is larger than the cell current Icell and generate the sense signal RES having a logic high level when the cell current Icell is larger than the reference current Iref.

The control logic portion 223_5 may generate the count enable signal CEN, the count clock signal CCLK and the ramp enable signal REN based on the buffered operation control signal BUF_CTRL, the buffered clock signal BUF_CLK and the sense signal RES.

The counting portion 223_3 may generate the count signal CNT_VAL that is sequentially counted based on the count enable signal CEN and the count clock signal CCLK.

The first ramp voltage generation portion 225_1 may supply to the bit line BL the first ramp voltage VRAMP1 that ramps from the reference voltage VSTB level to the high voltage VP level, based on the ramp enable signal REN. For example, the voltage charging unit 225_11 may precharge the first node NN1 with the reference voltage VSTB based on the inversion signal RENB of the ramp enable signal REN. The voltage charging unit 225_11 may increase the voltage level of the first node NN1 from the reference voltage VSTB level to the high voltage VP level by sourcing the first current Iramp1 to the first node NN1 based on the ramp enable signal REN. The first ramp voltage output unit 225_13 may output the voltage loaded on the first node NN1 as the first ramp voltage VRAMP1.

The second ramp voltage generation portion 225_3 may supply to the word line WL the second ramp voltage VRAMP2 that ramps from the reference voltage VSTB level to the low voltage VN level, based on the ramp enable signal REN. For example, the voltage discharging unit 225_31 may precharge the second node NN2 with the reference voltage VSTB based on the inversion signal RENB of the ramp enable signal REN. The voltage discharging unit 225_31 may decrease the voltage level of the second node NN2 from the reference voltage VSTB level to the low voltage VN level by sourcing the second current Iramp2 to the second node NN2 based on the ramp enable signal REN. The second ramp voltage output unit 225_33 may output the voltage loaded on the second node NN2 as the second ramp voltage VRAMP2.

Subsequently, when the voltage difference between both sides of the memory cell 210 reaches the threshold voltage, the sensing portion 223_1 may generate the sense signal RES having the logic high level. For example, the selection element S included in the memory cell 210 may be turned on based on the voltage difference corresponding to the threshold voltage. Thus, the cell current Icell flowing through the bit line BL, the memory cell 210 and the word line WL may increase. The sensing portion 223_1 may generate the sense signal RES having the logic high level since the cell current Icell is larger than the reference current Iref as a result of comparing the cell current Icell with the reference current Iref.

The control logic portion 223_5 may detect a count value N counted until now as a last count value N based on the sense signal RES of the logic high level and may generate the to-be-buffered result information signal BUF_VAL corresponding to the last count value N.

The output buffer portion 221_5 may buffer the to-be-buffered result information signal BUF_VAL to generate the result information signal CNT_LAST_VAL.

The foregoing operation may be performed on the variable resistance element M of a low resistance state and the variable resistance element M of a high resistance state. Therefore, the threshold voltage corresponding to the low resistance state (hereinafter, referred to as a "first threshold voltage") and the threshold voltage corresponding to the high resistance state (hereinafter, referred to as a "second threshold voltage") may be determined. In actuality, since the foregoing operation is performed on a plurality of memory cells, a distribution of a plurality of first threshold voltages and second threshold voltages corresponding to the memory cells may be determined. This may be used as an important factor when an optimum read condition, e.g., a read voltage, is set.

In accordance with the implementations of the technology disclosed in this patent document, as a threshold voltage of a memory cell is determined, an optimal read condition may be set.

As a result, since the threshold voltage of the memory cell is easily determined, the operational characteristics of a semiconductor memory may be improved.

The above and other memory circuits or semiconductor devices based on the disclosed technology may be used in a range of devices or systems. FIGS. 12-16 provide some examples of devices or systems that may implement the memory circuits disclosed herein.

Figure 12:
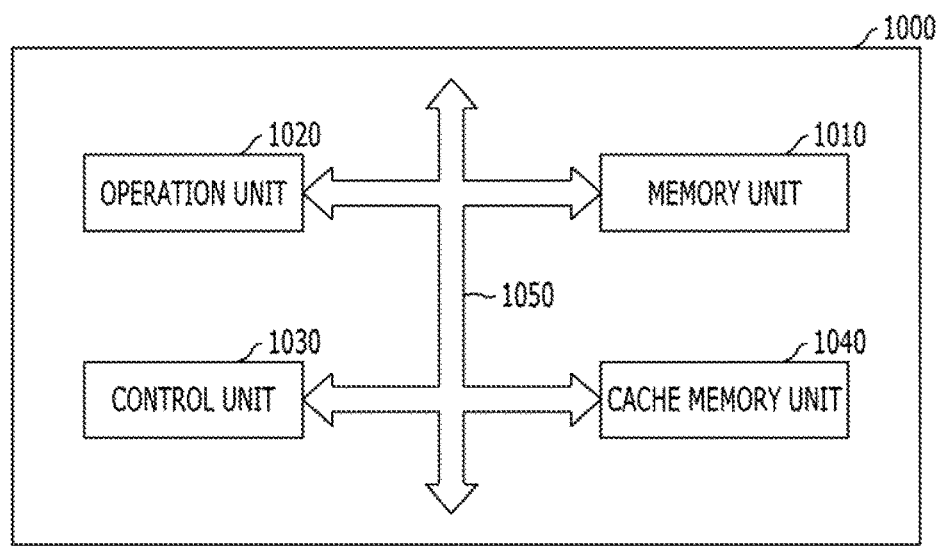
FIG. 12 is an example of configuration diagram of a microprocessor implementing memory circuitry based on the disclosed technology.

FIG. 12 is an example of configuration diagram of a microprocessor implementing memory circuitry based on the disclosed technology.

Referring to FIG. 12, a microprocessor 1000 may perform tasks for controlling and tuning a series of processes of receiving data from various external devices, processing the data, and outputting processing results to external devices. The microprocessor 1000 may include a memory unit 1010, an operation unit 1020, a control unit 1030, and so on. The microprocessor 1000 may be various data processing units such as a central processing unit (CPU), a graphic processing unit (GPU), a digital signal processor (DSP) and an application processor (AP).

The memory unit 1010 is a part which stores data in the microprocessor 1000, as a processor register, or the like. The memory unit 1010 may include a data register, an address register, a floating point register and so on. Besides, the memory unit 1010 may include various registers. The memory unit 1010 may perform the function of temporarily storing data for which operations are to be performed by the operation unit 1020, result data of performing the operations and addresses where data for performing of the operations are stored.

The memory unit 1010 may include one or more of the above-described semiconductor devices in accordance with the implementations. For example, the memory unit 1010 may include a first line; a second line intersecting the first line; a memory cell coupled at a cross point of the first line and the second line; and a test control circuit coupled between the first line and the second line and controlling a parameter corresponding to operational characteristics of the memory cell and outputting a result information signal corresponding to the control result to a pad based on a clock signal and an initial value set signal. Through this, characteristics of the memory unit 1010 may be improved. As a consequence, performance characteristics of the microprocessor 1000 may be improved.

The operation unit 1020 may perform four arithmetical operations or logical operations according to results that the control unit 1030 decodes commands. The operation unit 1020 may include at least one arithmetic logic unit (ALU) and so on.

The control unit 1030 may receive signals from the memory unit 1010, the operation unit 1020 and an external device of the microprocessor 1000, perform extraction, decoding of commands, and controlling input and output of signals of the microprocessor 1000, and execute processing represented by programs.

The microprocessor 1000 according to the present implementation may additionally include a cache memory unit 1040 which can temporarily store data to be inputted from an external device other than the memory unit 1010 or to be outputted to an external device. In this case, the cache memory unit 1040 may exchange data with the memory unit 1010, the operation unit 1020 and the control unit 1030 through a bus interface 1050.

Figure 13:
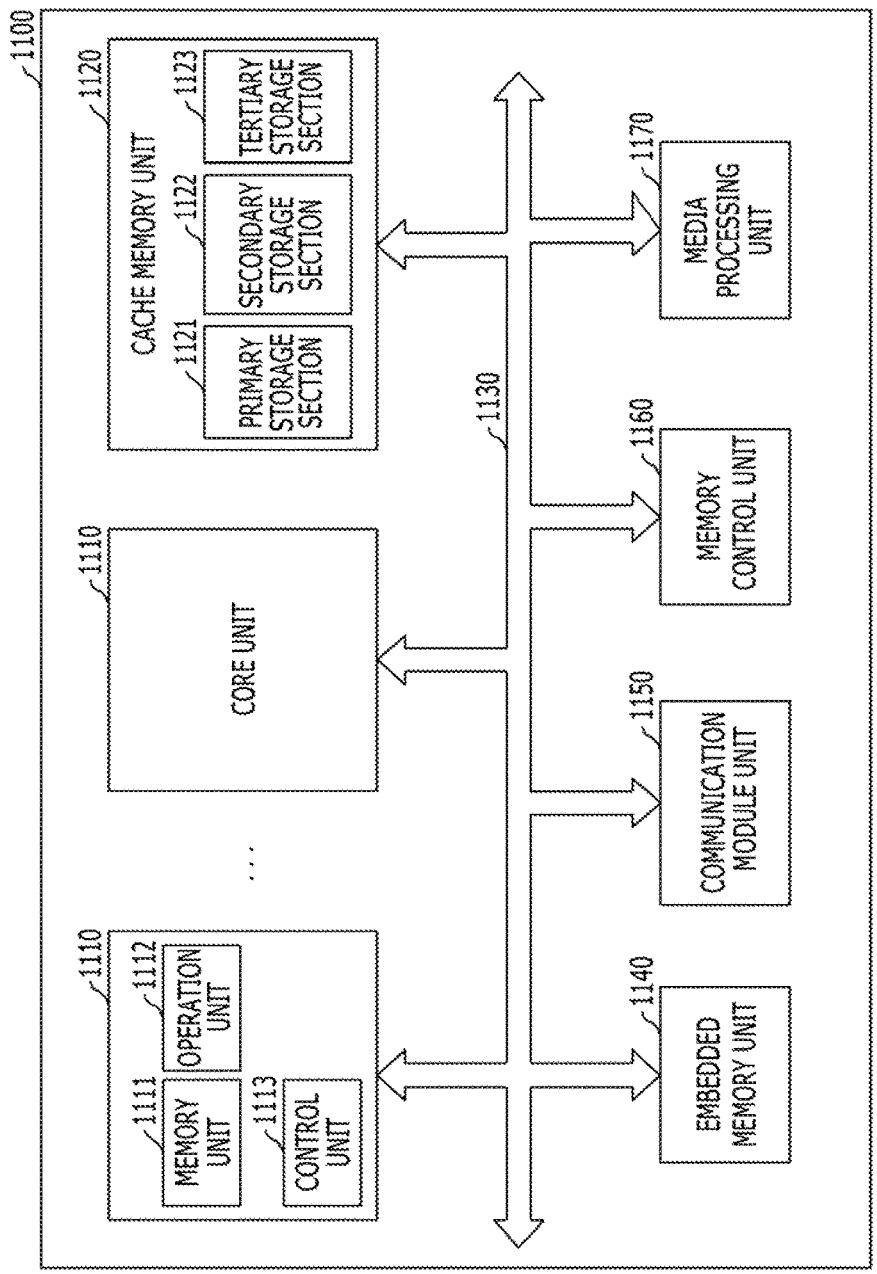
FIG. 13 is an example of configuration diagram of a processor implementing memory circuitry based on the disclosed technology.

FIG. 13 is an example of configuration diagram of a processor implementing memory circuitry based on the disclosed technology.

Referring to FIG. 13, a processor 1100 may improve performance and realize multi-functionality by including various functions other than those of a microprocessor which performs tasks for controlling and tuning a series of processes of receiving data from various external devices, processing the data, and outputting processing results to external devices. The processor 1100 may include a core unit 1110 which serves as the microprocessor, a cache memory unit 1120 which serves to storing data temporarily, and a bus interface 1130 for transferring data between internal and external devices. The processor 1100 may include various system-on-chips (SoCs) such as a multi-core processor, a graphic processing unit (GPU) and an application processor (AP).

The core unit 1110 of the present implementation is a part which performs arithmetic logic operations for data inputted from an external device, and may include a memory unit 1111, an operation unit 1112 and a control unit 1113.

The memory unit 1111 is a part which stores data in the processor 1100, as a processor register, a register or the like. The memory unit 1111 may include a data register, an address register, a floating point register and so on. Besides, the memory unit 1111 may include various registers. The memory unit 1111 may perform the function of temporarily storing data for which operations are to be performed by the operation unit 1112, result data of performing the operations and addresses where data for performing of the operations are stored. The operation unit 1112 is a part which performs operations in the processor 1100. The operation unit 1112 may perform four arithmetical operations, logical operations, according to results that the control unit 1113 decodes commands, or the like. The operation unit 1112 may include at least one arithmetic logic unit (ALU) and so on. The control unit 1113 may receive signals from the memory unit 1111, the operation unit 1112 and an external device of the processor 1100, perform extraction, decoding of commands, controlling input and output of signals of processor 1100, and execute processing represented by programs.

The cache memory unit 1120 is a part which temporarily stores data to compensate for a difference in data processing speed between the core unit 1110 operating at a high speed and an external device operating at a low speed. The cache memory unit 1120 may include a primary storage section 1121, a secondary storage section 1122 and a tertiary storage section 1123. In general, the cache memory unit 1120 includes the primary and secondary storage sections 1121 and 1122, and may include the tertiary storage section 1123 in the case where high storage capacity is required. As the occasion demands, the cache memory unit 1120 may include an increased number of storage sections. That is to say, the number of storage sections which are included in the cache memory unit 1120 may be changed according to a design. The speeds at which the primary, secondary and tertiary storage sections 1121, 1122 and 1123 store and discriminate data may be the same or different. In the case where the speeds of the respective storage sections 1121, 1122 and 1123 are different, the speed of the primary storage section 1121 may be largest. At least one storage section of the primary storage section 1121, the secondary storage section 1122 and the tertiary storage section 1123 of the cache memory unit 1120 may include one or more of the above-described semiconductor devices in accordance with the implementations. For example, the cache memory unit 1120 may include a first line; a second line intersecting the first line; a memory cell coupled at a cross point of the first line and the second line; and a test control circuit coupled between the first line and the second line and controlling a parameter corresponding to operational characteristics of the memory cell and outputting a result information signal corresponding to the control result to a pad based on a clock signal and an initial value set signal. Through this, characteristics of the cache memory unit 1120 may be improved. As a consequence, performance characteristics of the processor 1100 may be improved.

Although it was shown in FIG. 13 that all the primary, secondary and tertiary storage sections 1121, 1122 and 1123 are configured inside the cache memory unit 1120, it is to be noted that all the primary, secondary and tertiary storage sections 1121, 1122 and 1123 of the cache memory unit 1120 may be configured outside the core unit 1110 and may compensate for a difference in data processing speed between the core unit 1110 and the external device. Meanwhile, it is to be noted that the primary storage section 1121 of the cache memory unit 1120 may be disposed inside the core unit 1110 and the secondary storage section 1122 and the tertiary storage section 1123 may be configured outside the core unit 1110 to strengthen the function of compensating for a difference in data processing speed. In another implementation, the primary and secondary storage sections 1121, 1122 may be disposed inside the core units 1110 and tertiary storage sections 1123 may be disposed outside core units 1110.

The bus interface 1130 is a part which connects the core unit 1110, the cache memory unit 1120 and external device and allows data to be efficiently transmitted.

The processor 1100 according to the present implementation may include a plurality of core units 1110, and the plurality of core units 1110 may share the cache memory unit 1120. The plurality of core units 1110 and the cache memory unit 1120 may be directly connected or be connected through the bus interface 1130. The plurality of core units 1110 may be configured in the same way as the above-described configuration of the core unit 1110. In the case where the processor 1100 includes the plurality of core unit 1110, the primary storage section 1121 of the cache memory unit 1120 may be configured in each core unit 1110 in correspondence to the number of the plurality of core units 1110, and the secondary storage section 1122 and the tertiary storage section 1123 may be configured outside the plurality of core units 1110 in such a way as to be shared through the bus interface 1130. The processing speed of the primary storage section 1121 may be larger than the processing speeds of the secondary and tertiary storage section 1122 and 1123. In another implementation, the primary storage section 1121 and the secondary storage section 1122 may be configured in each core unit 1110 in correspondence to the number of the plurality of core units 1110, and the tertiary storage section 1123 may be configured outside the plurality of core units 1110 in such a way as to be shared through the bus interface 1130.

The processor 1100 according to the present implementation may further include an embedded memory unit 1140 which stores data, a communication module unit 1150 which can transmit and receive data to and from an external device in a wired or wireless manner, a memory control unit 1160 which drives an external memory device, and a media processing unit 1170 which processes the data processed in the processor 1100 or the data inputted from an external input device and outputs the processed data to an external interface device and so on. Besides, the processor 1100 may include a plurality of various modules and devices. In this case, the plurality of modules which are added may exchange data with the core units 1110 and the cache memory unit 1120 and with one another, through the bus interface 1130.

The embedded memory unit 1140 may include not only a volatile memory but also a nonvolatile memory. The volatile memory may include a DRAM (dynamic random access memory), a mobile DRAM, an SRAM (static random access memory), and a memory with similar functions to above mentioned memories, and so on. The nonvolatile memory may include a ROM (read only memory), a NOR flash memory, a NAND flash memory, a phase change random access memory (PRAM), a resistive random access memory (RRAM), a spin transfer torque random access memory (STTRAM), a magnetic random access memory (MRAM), a memory with similar functions.

The communication module unit 1150 may include a module capable of being connected with a wired network, a module capable of being connected with a wireless network and both of them. The wired network module may include a local area network (LAN), a universal serial bus (USB), an Ethernet, power line communication (PLC) such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB) such as various devices which send and receive data without transmit lines, and so on.

The memory control unit 1160 is to administrate and process data transmitted between the processor 1100 and an external storage device operating according to a different communication standard. The memory control unit 1160 may include various memory controllers, for example, devices which may control IDE (Integrated Device Electronics), SATA (Serial Advanced Technology Attachment), SCSI (Small Computer System Interface), RAID (Redundant Array of Independent Disks), an SSD (solid state disk), eSATA (External SATA), PCMCIA (Personal Computer Memory Card International Association), a USB (universal serial bus), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The media processing unit 1170 may process the data processed in the processor 1100 or the data inputted in the forms of image, voice and others from the external input device and output the data to the external interface device. The media processing unit 1170 may include a graphic processing unit (GPU), a digital signal processor (DSP), a high definition audio device (HD audio), a high definition multimedia interface (HDMI) controller, and so on.

Figure 14:
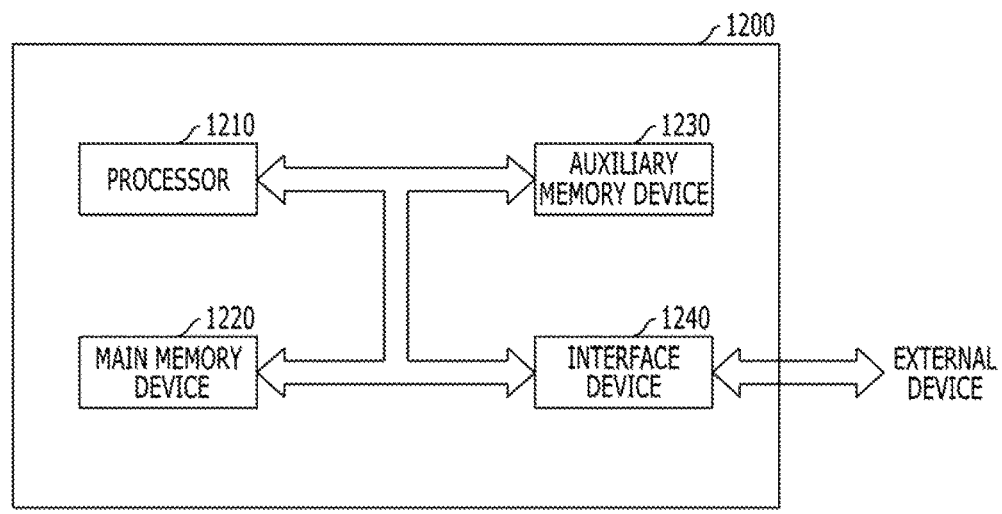
FIG. 14 is an example of configuration diagram of a system implementing memory circuitry based on the disclosed technology.

FIG. 14 is an example of configuration diagram of a system implementing memory circuitry based on the disclosed technology.

Referring to FIG. 14, a system 1200 as an apparatus for processing data may perform input, processing, output, communication, storage, etc. to conduct a series of manipulations for data. The system 1200 may include a processor 1210, a main memory device 1220, an auxiliary memory device 1230, an interface device 1240, and so on. The system 1200 of the present implementation may be various electronic systems which operate using processors, such as a computer, a server, a PDA (personal digital assistant), a portable computer, a web tablet, a wireless phone, a mobile phone, a smart phone, a digital music player, a PMP (portable multimedia player), a camera, a global positioning system (GPS), a video camera, a voice recorder, a telematics, an audio visual (AV) system, a smart television, and so on.

The processor 1210 may decode inputted commands and processes operation, comparison, etc. for the data stored in the system 1200, and controls these operations. The processor 1210 may include a microprocessor unit (MPU), a central processing unit (CPU), a single/multi-core processor, a graphic processing unit (GPU), an application processor (AP), a digital signal processor (DSP), and so on.

The main memory device 1220 is a storage which may temporarily store, call and execute program codes or data from the auxiliary memory device 1230 when programs are executed and can conserve memorized contents even when power supply is cut off. The main memory device 1220 may include one or more of the above-described semiconductor devices in accordance with the implementations. For example, the main memory device 1220 may include a first line; a second line intersecting the first line; a memory cell coupled at a cross point of the first line and the second line; and a test control circuit coupled between the first line and the second line and controlling a parameter corresponding to operational characteristics of the memory cell and outputting a result information signal corresponding to the control result to a pad based on a clock signal and an initial value set signal. Through this, characteristics of the main memory device 1220 may be improved. As a consequence, performance characteristics of the system 1200 may be improved.

Also, the main memory device 1220 may further include a static random access memory (SRAM), a dynamic random access memory (DRAM), and so on, of a volatile memory type in which all contents are erased when power supply is cut off. Unlike this, the main memory device 1220 may not include the semiconductor devices according to the implementations, but may include a static random access memory (SRAM), a dynamic random access memory (DRAM), and so on, of a volatile memory type in which all contents are erased when power supply is cut off.

The auxiliary memory device 1230 is a memory device for storing program codes or data. While the speed of the auxiliary memory device 1230 is slower than the main memory device 1220, the auxiliary memory device 1230 can store a larger amount of data. The auxiliary memory device 1230 may include one or more of the above-described semiconductor devices in accordance with the implementations. For example, the auxiliary memory device 1230 may include a first line; a second line intersecting the first line; a memory cell coupled at a cross point of the first line and the second line; and a test control circuit coupled between the first line and the second line and controlling a parameter corresponding to operational characteristics of the memory cell and outputting a result information signal corresponding to the control result to a pad based on a clock signal and an initial value set signal. Through this, characteristics of the auxiliary memory device 1230 may be improved. As a consequence, performance characteristics of the system 1200 may be improved.

Also, the auxiliary memory device 1230 may further include a data storage system (see the reference numeral 1300 of FIG. 15) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on. Unlike this, the auxiliary memory device 1230 may not include the semiconductor devices according to the implementations, but may include data storage systems (see the reference numeral 1300 of FIG. 15) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The interface device 1240 may be to perform exchange of commands and data between the system 1200 of the present implementation and an external device. The interface device 1240 may be a keypad, a keyboard, a mouse, a speaker, a mike, a display, various human interface devices (HIDs), a communication device, and so on. The communication device may include a module capable of being connected with a wired network, a module capable of being connected with a wireless network and both of them. The wired network module may include a local area network (LAN), a universal serial bus (USB), an Ethernet, power line communication (PLC), such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB), such as various devices which send and receive data without transmit lines, and so on.

Figure 15:
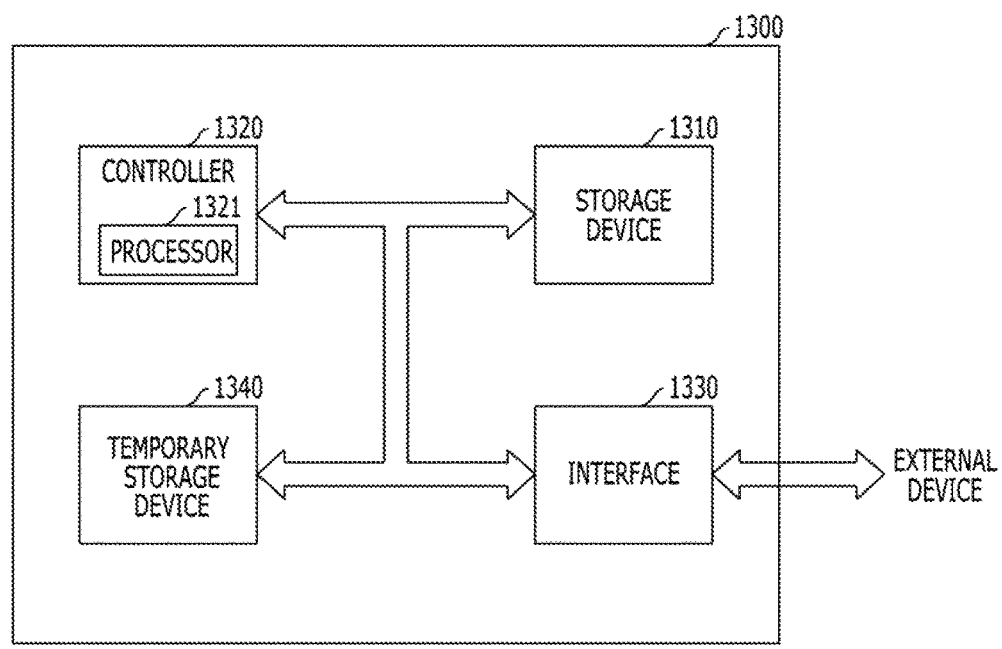
FIG. 15 is an example of configuration diagram of a data storage system implementing memory circuitry based on the disclosed technology.

FIG. 15 is an example of configuration diagram of a data storage system implementing memory circuitry based on the disclosed technology.

Referring to FIG. 15, a data storage system 1300 may include a storage device 1310 which has a nonvolatile characteristic as a component for storing data, a controller 1320 which controls the storage device 1310, an interface 1330 for connection with an external device, and a temporary storage device 1340 for storing data temporarily. The data storage system 1300 may be a disk type such as a hard disk drive (HDD), a compact disc read only memory (CDROM), a digital versatile disc (DVD), a solid state disk (SSD), and so on, and a card type such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The storage device 1310 may include a nonvolatile memory which stores data semi-permanently. The nonvolatile memory may include a ROM (read only memory), a NOR flash memory, a NAND flash memory, a phase change random access memory (PRAM), a resistive random access memory (RRAM), a magnetic random access memory (MRAM), and so on.

The controller 1320 may control exchange of data between the storage device 1310 and the interface 1330. To this end, the controller 1320 may include a processor 1321 for performing an operation for, processing commands inputted through the interface 1330 from an outside of the data storage system 1300 and so on.

The interface 1330 is to perform exchange of commands and data between the data storage system 1300 and the external device. In the case where the data storage system 1300 is a card type, the Interface 1330 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. In the case where the data storage system 1300 is a disk type, the interface 1330 may be compatible with interfaces, such as IDE (Integrated Device Electronics), SATA (Serial Advanced Technology Attachment), SCSI (Small Computer System Interface), eSATA (External SATA), PCMCIA (Personal Computer Memory Card International Association), a USB (universal serial bus), and so on, or be compatible with the interfaces which are similar to the above mentioned interfaces. The interface 1330 may be compatible with one or more interfaces having a different type from each other.

The temporary storage device 1340 can store data temporarily for efficiently transferring data between the interface 1330 and the storage device 1310 according to diversifications and high performance of an interface with an external device, a controller and a system. The temporary storage device 1340 for temporarily storing data may include one or more of the above-described semiconductor devices in accordance with the implementations. For example, the temporary storage device 1340 may include a first line; a second line intersecting the first line; a memory cell coupled at a cross point of the first line and the second line; and a test control circuit coupled between the first line and the second line and controlling a parameter corresponding to operational characteristics of the memory cell and outputting a result information signal corresponding to the control result to a pad based on a clock signal and an initial value set signal. Through this, characteristics of the temporary storage device 1340 may be improved. As a consequence, performance characteristics of the system 1300 may be improved.

Figure 16:
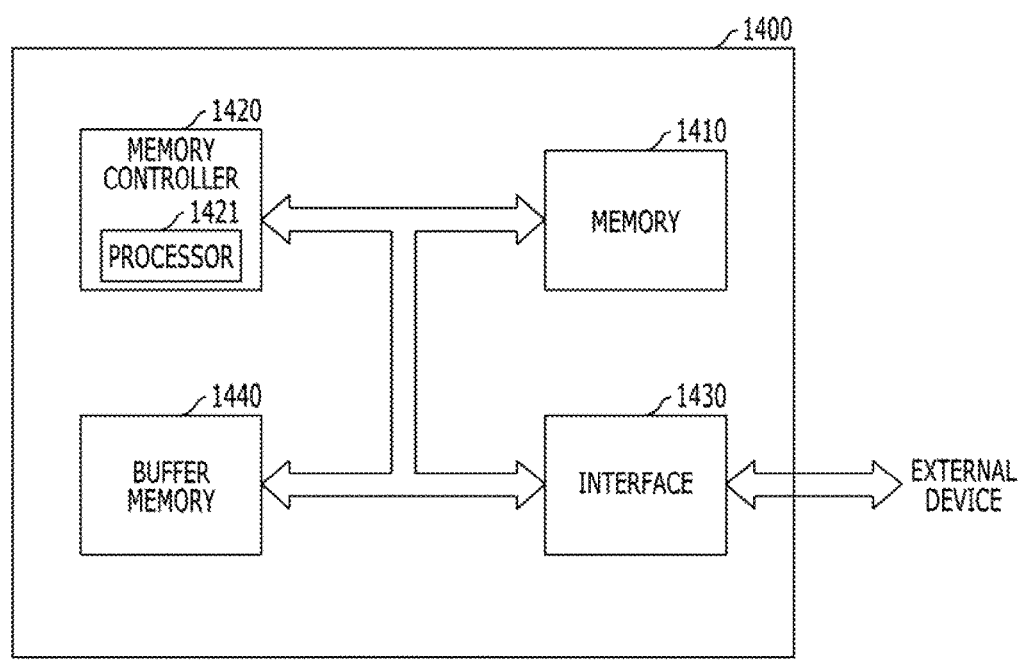
FIG. 16 is an example of configuration diagram of a memory system implementing memory circuitry based on the disclosed technology.

FIG. 16 is an example of configuration diagram of a memory system implementing memory circuitry based on the disclosed technology.

Referring to FIG. 16, a memory system 1400 may include a memory 1410 which has a nonvolatile characteristic as a component for storing data, a memory controller 1420 which controls the memory 1410, an interface 1430 for connection with an external device, and so on. The memory system 1400 may be a card type such as a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The memory 1410 for storing data may include one or more of the above-described semiconductor devices in accordance with the implementations. For example, the memory 1410 may include a first line; a second line intersecting the first line; a memory cell coupled at a cross point of the first line and the second line; and a test control circuit coupled between the first line and the second line and controlling a parameter corresponding to operational characteristics of the memory cell and outputting a result information signal corresponding to the control result to a pad based on a clock signal and an initial value set signal. Through this, characteristics of the memory 1410 may be improved. As a consequence, performance characteristics of the microprocessor 1400 may be improved.

Through this, the performance of the memory system 1400 may be improved by performing a stable sense and amplification operation.

Also, the memory 1410 according to the present implementation may further include a ROM (read only memory), a NOR flash memory, a NAND flash memory, a phase change random access memory (PRAM), a resistive random access memory (RRAM), a magnetic random access memory (MRAM), and so on, which have a nonvolatile characteristic.

The memory controller 1420 may control exchange of data between the memory 1410 and the interface 1430. To this end, the memory controller 1420 may include a processor 1421 for performing an operation for and processing commands inputted through the interface 1430 from an outside of the memory system 1400.

The interface 1430 is to perform exchange of commands and data between the memory system 1400 and the external device. The interface 1430 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. The interface 1430 may be compatible with one or more interfaces having a different type from each other.

The memory system 1400 according to the present implementation may further include a buffer memory 1440 for efficiently transferring data between the interface 1430 and the memory 1410 according to diversification and high performance of an interface with an external device, a memory controller and a memory system. For example, the buffer memory 1440 for temporarily storing data may include one or more of the above-described semiconductor devices in accordance with the implementations. The buffer memory 1440 may include a first line; a second line intersecting the first line; a memory cell coupled at a cross point of the first line and the second line; and a test control circuit coupled between the first line and the second line and controlling a parameter corresponding to operational characteristics of the memory cell and outputting a result information signal corresponding to the control result to a pad based on a clock signal and an initial value set signal. Through this, characteristics of the buffer memory 1440 may be improved. As a consequence, performance characteristics of the microprocessor 1400 may be improved.

Moreover, the buffer memory 1440 according to the present implementation may further include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic. Unlike this, the buffer memory 1440 may not include the semiconductor devices according to the implementations, but may include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic.

As is apparent from the above descriptions, in the semiconductor device and the method for fabricating the same in accordance with the implementations, patterning of a resistance variable element is easy, and it is possible to secure the characteristics of the resistance variable element.

Features in the above examples of electronic devices or systems in FIGS. 12-16 based on the memory devices disclosed in this document may be implemented in various devices, systems or applications. Some examples include mobile phones or other portable communication devices, tablet computers, notebook or laptop computers, game machines, smart TV sets, TV set top boxes, multimedia servers, digital cameras with or without wireless communication functions, wrist watches or other wearable devices with wireless communication capabilities.

While this present document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve described results. Moreover, the separation of various system components in the embodiments described in this patent document should not be understood as requiring such separation in all embodiments. Only a few implementations and examples are described. Other implementations, enhancements and variations can be made based on what is described and Illustrated in this patent document.

What is claimed is:

1. An electronic device, comprising a semiconductor memory that includes:
   a first line;
   a second line intersecting the first line;
   a memory cell coupled at a cross point of the first line and the second line; and
   a test control circuit coupled between the first line and the second line and suitable for controlling parameters corresponding to operational characteristics of the memory cell and outputting a result information signal corresponding to the control result to a pad based on a clock signal and an initial value set signal.

2. The electronic device according to claim 1, wherein the test control circuit supplies a ramp voltage to the first line based on a cell current flowing through the second line and outputs the result information signal corresponding to the cell current to the pad based on the clock signal and the initial value set signal.

3. The electronic device according to claim 2, wherein the test control circuit includes:
   a first control block suitable for generating the result information signal corresponding to the cell current and a count signal based on the clock signal and the initial value set signal; and
   a second control block suitable for generating the ramp voltage based on the count signal.

4. The electronic device according to claim 3, wherein the first control block includes:
   a sensing portion suitable for sensing the cell current; and
   a counting portion suitable for generating the count signal and the result information signal based on the clock signal, the initial value set signal and a sense signal outputted from the sensing portion, wherein the result information signal corresponds to a last count value of the count signal.

5. The electronic device according to claim 4, wherein the sensing portion includes:

a current sinking unit suitable for sinking a reference current from the second line; and a sense signal generation unit suitable for generating the sense signal based on a voltage level of the second line wherein the voltage level of the second line is defined based on the cell current and the reference current.

6. The electronic device according to claim 3, wherein the second control block includes:

a decoding portion suitable for generating a decoding signal based on the count signal; and a ramp voltage generation portion suitable for generating the ramp voltage based on the decoding signal.

7. The electronic device of claim 1, further comprising a microprocessor which includes:

a control unit suitable for receiving a signal including a command from an outside of the microprocessor, and performs extracting, decoding of the command, or controlling input or output of a signal of the microprocessor;

an operation unit suitable for performing an operation based on a result that the control unit decodes the command; and a memory unit suitable for storing data for performing the operation, data corresponding to a result of performing the operation, or an address of data for which the operation is performed, wherein the semiconductor memory is part of the memory unit in the microprocessor.

8. The electronic device of claim 1, further comprising a processor which includes:

a core unit suitable for performing, based on a command inputted from an outside of the processor, an operation corresponding to the command, by using data;

a cache memory unit suitable for storing data for performing the operation, data corresponding to a result of performing the operation, or an address of data for which the operation is performed; and a bus interface connected between the core unit and the cache memory unit, and suitable for transmitting data between the core unit and the cache memory unit, wherein the semiconductor memory that is part of the cache memory unit in the processor.

9. The electronic device of claim 1, further comprising a processing system which includes:

a processor suitable for decoding a command received by the processor and controlling an operation for information based on a result of decoding the command;

an auxiliary memory device suitable for storing a program for decoding the command and the information;

a main memory device suitable for calling and storing the program and the information from the auxiliary memory device such that the processor can perform the operation using the program and the Information when executing the program; and an interface device suitable for performing communication between at least one of the processor, the auxiliary memory device and the main memory device and the outside, wherein the semiconductor memory is part of the auxiliary memory device or the main memory device in the processing system.

10. The electronic device of claim 1, further comprising a data storage system which includes:

a storage device suitable for storing data and conserving stored data regardless of power supply;

a controller suitable for controlling input and output of data to and from the storage device according to a command inputted from an outside;

a temporary storage device suitable for temporarily storing data exchanged between the storage device and the outside; and an interface suitable for performing communication between at least one of the storage device, the controller and the temporary storage device and the outside, wherein the semiconductor memory is part of the storage device or the temporary storage device in the data storage system.

11. The electronic device of claim 1, further comprising a memory system which includes:

a memory suitable for storing data and conserving stored data regardless of power supply;

a memory controller suitable for controlling input and output of data to and from the memory according to a command inputted from an outside;

a buffer memory suitable for buffering data exchanged between the memory and the outside; and an interface suitable for performing communication between at least one of the memory, the memory controller and the buffer memory and the outside, wherein the semiconductor memory is part of the memory or the buffer memory in the memory system.

12. An electronic device, comprising a semiconductor memory that includes:

a first line;

a second line intersecting the first line;

a memory cell coupled at a cross point of the first line and the second line; and a test control circuit suitable for supplying first and second ramp voltages to the first and second lines based on a cell current flowing through the second line and outputting a result information signal corresponding to the cell current to a pad based on a clock signal and an operation control signal.

13. The electronic device according to claim 12, wherein the test control circuit includes:

a first control block suitable for generating the result information signal corresponding to a voltage level of the second line and a ramp enable signal based on the clock signal and the operation control signal; and a second control block suitable for generating the first and second ramp voltages based on the ramp enable signal.

14. The electronic device according to claim 13, wherein the first control block includes:

a sensing portion suitable for sensing the cell current;

a counting portion suitable for generating a count signal based on a count enable signal and a count clock signal; and a control logic portion suitable for generating the count enable signal, the count clock signal, the result information signal and the ramp enable signal based on the sense signal, the count signal, the clock signal and the operation control signal, wherein the result information signal corresponds to a last count value of the count signal.

15. The electronic device according to claim 14, wherein the sensing portion includes:

a current sinking unit suitable for sinking a reference current from the second line; and a sense signal generation unit suitable for generating the sense signal based on the voltage level of the second line wherein the voltage level of the second line is defined based on the cell current and the reference current.

16. The electronic device according to claim 13, wherein the second control block includes:
   a first ramp voltage generation portion suitable for generating the first ramp voltage that ramps from a reference voltage to a high voltage based on the ramp enable signal; and
   a second ramp voltage generation portion suitable for generating the second ramp voltage that ramps from the reference voltage to a low voltage based on the ramp enable signal.

17. The electronic device according to claim 16, wherein the first ramp voltage generation portion includes:
   a voltage charging unit suitable for precharging a first node with the reference voltage based on an inversion signal of the ramp enable signal and sourcing a first current to the first node based on the ramp enable signal; and
   a first ramp voltage output unit suitable for outputting a voltage loaded on the first node as the first ramp voltage.

18. The electronic device according to claim 16, wherein the second ramp voltage generation portion includes:
   a voltage discharging unit suitable for precharging a second node with the reference voltage based on the inversion signal and sinking a second current from the second node based on the ramp enable signal; and
   a second ramp voltage output unit suitable for outputting a voltage loaded on the second node as the second ramp voltage.

19. A method for driving an electronic device including a semiconductor memory, comprising:
   gradually increasing a voltage difference between both sides of memory cell including a variable resistance element and a selection element; and
   determining a threshold voltage of the memory cell based on a voltage level of one side of the memory cell.

20. The method according to claim 19, wherein the gradual increasing of the voltage difference includes supplying a ramp voltage to the other side of the memory cell while one side of the memory cell is fixed at a low voltage, or supplying a first ramp voltage that ramps from a reference voltage to a high voltage to one side of the memory cell and supplying a second ramp voltage that ramps from the reference voltage to a low voltage to the other side of the memory cell.

* * * * *